(12) United States Patent
Fukushima et al.

(10) Patent No.: US 7,465,668 B2
(45) Date of Patent: Dec. 16, 2008

(54) METHOD OF MANUFACTURING SEMICONDUCTOR DEVICE

(75) Inventors: Dai Fukushima, Kamakura (JP); Gaku Minamihaba, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/296,483

(22) Filed: Dec. 8, 2005

(65) Prior Publication Data

US 2006/0175296 A1  Aug. 10, 2006

(30) Foreign Application Priority Data

Feb. 10, 2005 (JP) ............... 2005-034541

(51) Int. Cl.
*H01L 21/302* (2006.01)
(52) U.S. Cl. ...................... 438/692; 451/287
(58) Field of Classification Search ............. 438/689, 438/690, 691, 692, 693; 451/287, 288, 443
See application file for complete search history.

(56) References Cited

U.S. PATENT DOCUMENTS

| 6,059,920 | A | | 5/2000 | Nojo et al. |
| 6,139,400 | A | * | 10/2000 | Sato et al. ............... 451/10 |
| 6,455,432 | B1 | | 9/2002 | Tsai et al. |
| 6,565,422 | B1 | | 5/2003 | Homma et al. |
| 2001/0006841 | A1 | * | 7/2001 | Tsuchiya et al. ............ 438/584 |
| 2002/0146965 | A1 | * | 10/2002 | Thomas et al. ............... 451/41 |
| 2002/0168923 | A1 | * | 11/2002 | Kaufman et al. ............. 451/36 |
| 2003/0060145 | A1 | * | 3/2003 | Li et al. ..................... 451/66 |
| 2004/0009671 | A1 | * | 1/2004 | Kaufman et al. ............ 438/692 |
| 2005/0196954 | A1 | * | 9/2005 | Noguchi ..................... 438/622 |

FOREIGN PATENT DOCUMENTS

| JP | 3440826 | 6/2003 |
| JP | 2004-335896 | 11/2004 |

* cited by examiner

*Primary Examiner*—Kin-Chan Chen
(74) *Attorney, Agent, or Firm*—Finnegan, Henderson, Farabow, Garrett & Dunner, L.L.P.

(57) ABSTRACT

A method for manufacturing a semiconductor device is provided, which includes depositing a conductive film above an insulating film formed above a semiconductor substrate and having a recess, thereby forming a treating film, polishing the treating film while feeding a first chemical solution containing abrasive particles and a second chemical solution containing an oxidizing agent over a polishing pad, the treating film being contacted with the polishing pad at a first load, and subsequent to the polishing, subjecting a surface of the treating film to a chemical-polishing by continuing the feeding of the first chemical solution over the polishing pad while suspending the feeding of the second chemical solution, the treating film being contacted with the polishing pad at a second load which is smaller than the first load.

9 Claims, 4 Drawing Sheets

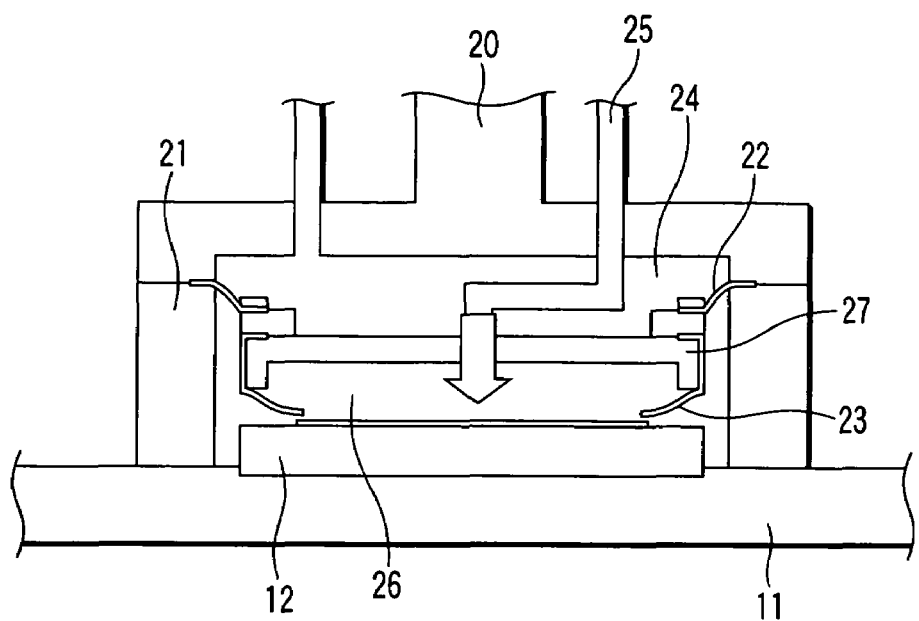
F I G. 3
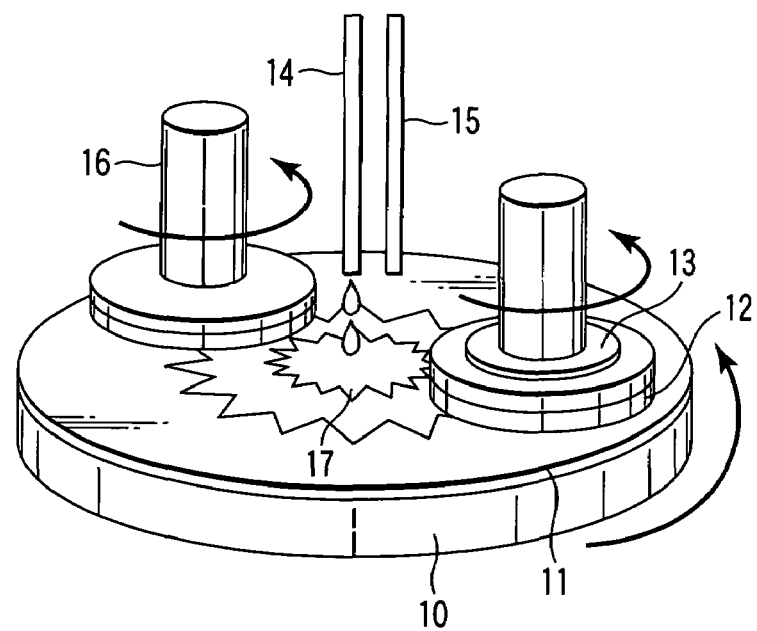
F I G. 4

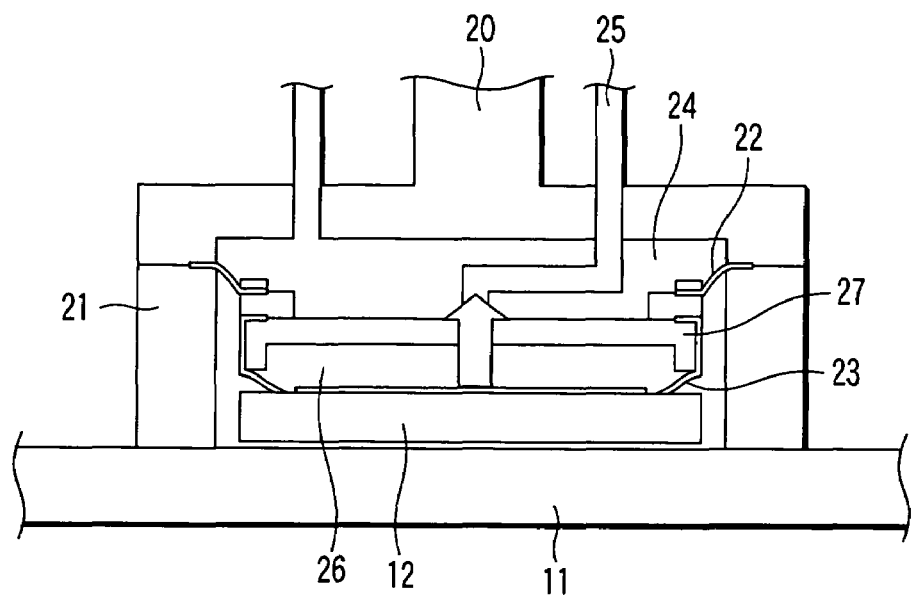
F I G. 5
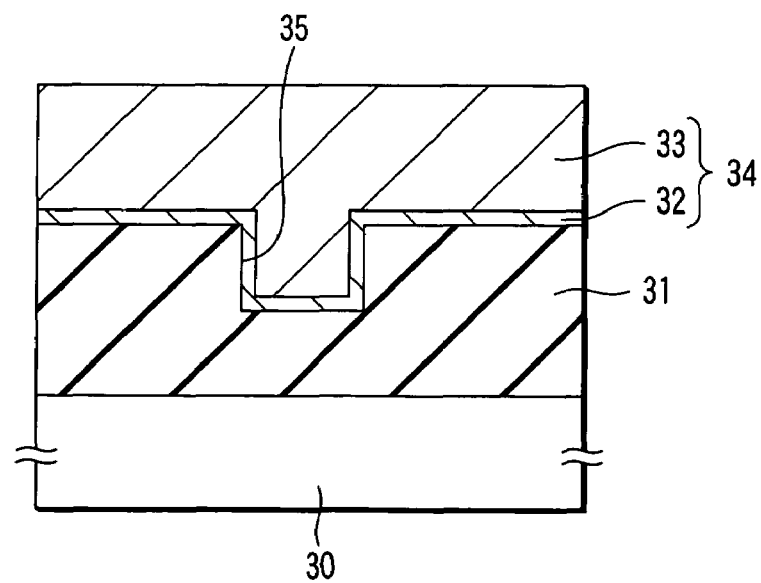
F I G. 6

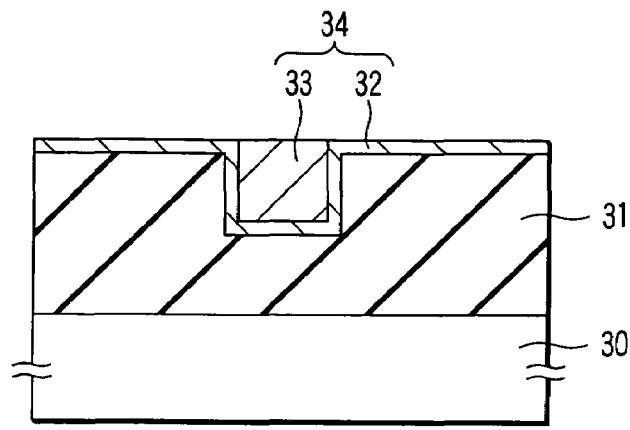
F I G. 7
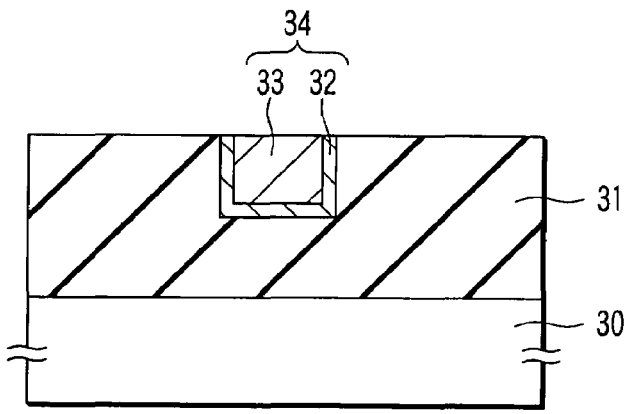
F I G. 8
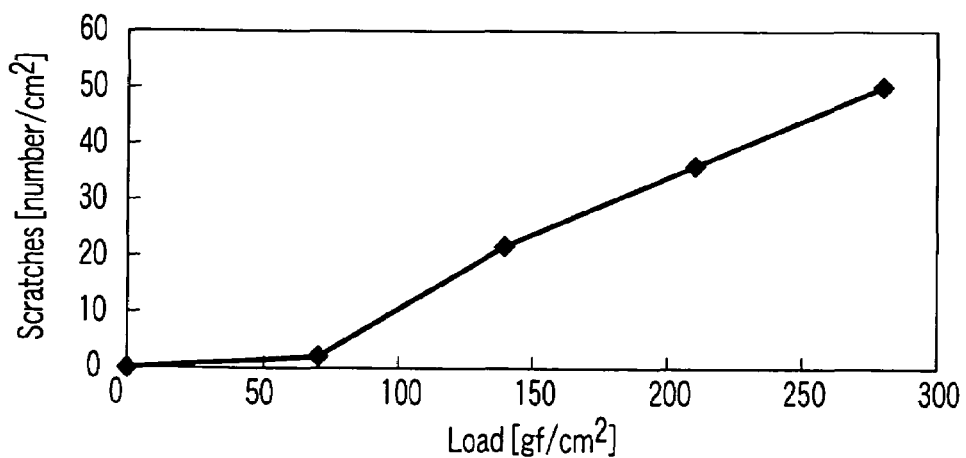
F I G. 9

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-034541, filed Feb. 10, 2005, the entire contents of which are incorporated herein by reference.

BACKGROUND OF THE INVENTION

1. Field of the Invention

The present invention relates to a method of manufacturing a semiconductor device, in particular, to a process of CMP (Chemical Mechanical Planarization) for forming a Cu damascene wiring, etc. of a high-velocity LOGIC-LSI.

2. Description of the Related Art

It is expected that the integration of semiconductor elements in high performance LSIs of the next generation would be inevitably further enhanced. For example, the design rule of damascene wirings to be formed by CMP is expected to become so severe that the line width of wirings is confined within the range of 0.07 to 30 μm and the film thickness of wirings is confined to 100 nm for example.

In the formation of damascene wirings having a film thickness of 100 nm for example, the CMP employing a slurry is generally adopted. Due to this CMP, the residues of shavings and components of slurry adhere to the surface of semiconductor device or of the polishing pad. Although most of these residues can be washed away by polishing using deionized water (DIW), it is difficult to sufficiently remove the oxides deposited on the surface of Cu wiring or the Cu compounds left remained on the polishing pad by deionized water. Therefore, in order to remove these Cu oxides and Cu compounds, it is required to perform chemical-polishing using an exclusive chemical solution comprising, as a major component, ammonia, inorganic acid such as hydrochloric acid, or organic acid such as citric acid.

If the polishing using such a chemical solution is to be performed, it is required to additionally prepare an installation dedicated to the chemical solution. Moreover, there is a risk of generating the corrosion of Cu due to the mixing of the chemical solution with the slurry. On the other hand, there are also noticed problems such as the generation of dust or scratches during the chemical-polishing or the generation of cracks of low-k film having a relative dielectric constant of 2.9 or less.

At present however, no one has succeeded in developing a manufacturing method of a semiconductor device which is capable of obviating the generation of these defects to obtain a semiconductor device of high reliability.

BRIEF SUMMARY OF THE INVENTION

A method for manufacturing a semiconductor device, according to one aspect of the present invention comprises depositing a conductive film above an insulating film formed above a semiconductor substrate and having a recess, thereby forming a treating film; polishing the treating film while feeding a first chemical solution containing abrasive particles and a second chemical solution containing an oxidizing agent over a polishing pad, the treating film being contacted with the polishing pad at a first load; and subsequent to the polishing, subjecting a surface of the treating film to a chemical-polishing by continuing the feeding of the first chemical solution over the polishing pad while suspending the feeding of the second chemical solution, the treating film being contacted with the polishing pad at a second load which is smaller than the first load.

A method for manufacturing a semiconductor device, according to another aspect of the present invention comprises depositing a conductive film above an underlayer film formed above a semiconductor substrate and having a recess, thereby forming a treating film; polishing the treating film until the underlayer film is exposed outside the recess while feeding a first chemical solution containing abrasive particles and a second chemical solution containing an oxidizing agent over the polishing pad with the treating film being kept contacted with a polishing pad at a first load; and subsequent to the polishing, slide-contacting the treating film and the exposed underlayer film with the polishing pad at a second load through the first chemical solution by continuing the feeding of the first chemical solution over the polishing pad while suspending the feeding of the second chemical solution, the second load being smaller than the first load.

BRIEF DESCRIPTION OF THE SEVERAL VIEWS OF THE DRAWING

FIG. 3 is a side view schematically illustrating a manner of holding a semiconductor substrate in the polishing step;

FIG. 4 is a perspective view schematically illustrating a state in the chemical-polishing step in the manufacturing method of a semiconductor device according to one embodiment of the present invention;

FIG. 5 is a side view schematically illustrating a manner of holding a semiconductor substrate in the chemical-polishing step;

FIG. 6 is a cross-sectional view illustrating a step in the method of manufacturing a semiconductor device according to one embodiment of the present invention;

FIG. 7 is a cross-sectional view illustrating a step next to the step shown in FIG. 6;

FIG. 8 is a cross-sectional view illustrating a step next to the step shown in FIG. 7; and FIG. 9 is a graph representing the relationship between the load and the generation of scratches.

DETAILED DESCRIPTION OF THE INVENTION

Next, embodiments of the present invention will be explained as follows with reference to Figures.

Figure 1:
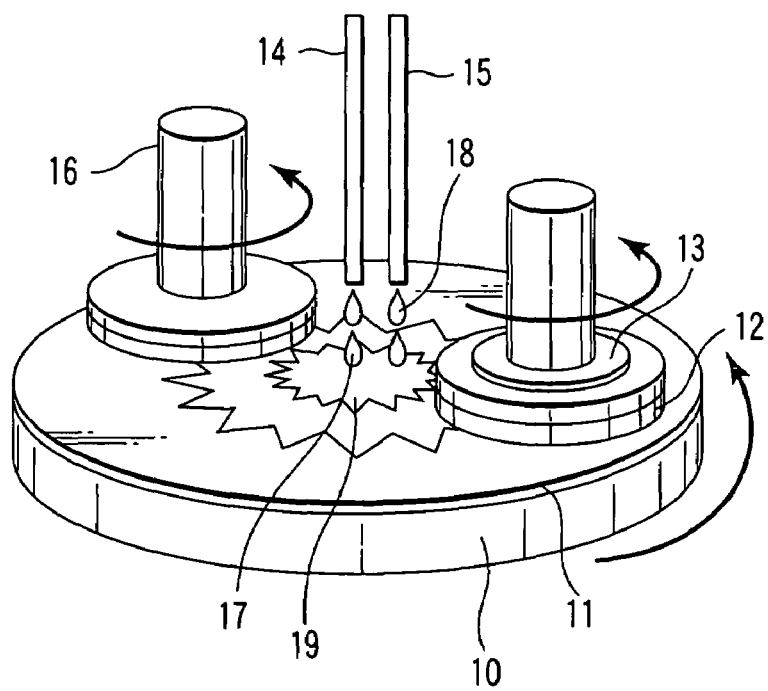
FIG. 1 is a perspective view schematically illustrating a state of the polishing step in the manufacturing method of a semiconductor device according to one embodiment of the present invention.

FIG. 1 schematically illustrates a state of the polishing step in the manufacturing method of a semiconductor device according to one embodiment of the present invention.

In the polishing step, while rotating a turntable 10 having a polishing pad 11 attached thereto as shown in FIG. 1, a top ring 13 holding a semiconductor substrate 12 is allowed to contact with the turntable 10. As for the rotational speed of the turntable 10, it may be 10 to 150 rpm for example. As for the rotational speed of the top ring 13, it may be about 10 to 120 rpm in general. The polishing load in the polishing step, i.e., the first load may be 100 to 700 gf/cm$^2$ in general.

A first chemical solution 17 containing abrasive particles is fed from a first supply port 14 to the polishing pad 11, and at the same time, a second chemical solution 18 containing an oxidizing agent from a second supply port 15 to the polishing pad 11. The first chemical solution 17 and the second chemical solution 18 are mixed together at a use point on the polishing pad 11, thereby preparing a slurry 19. By using the slurry 19 thus prepared, the treating film (not shown) formed on the semiconductor substrate 12 is polished. Incidentally, FIG. 1 also shows a dresser 16.

The reason for separately feeding the first chemical solution 17 containing abrasive particles and the second chemical solution 18 containing an oxidizing agent is as follows. Namely, the oxidizing agent may be decomposed with time or may cause the aggregation or dissolution of abrasive particles. In that case, there may be generated various problems such as the deterioration of polishing speed or the increase of scratches. In order to obviate these problems originating from this oxidizing agent, the first chemical solution 17 containing abrasive particles is preserved separate from the second chemical solution 18 containing an oxidizing agent, and these first chemical solution 17 and second chemical solution 18 are mixed together and formed into a slurry 19 immediately before being employed for polishing.

Figure 2:
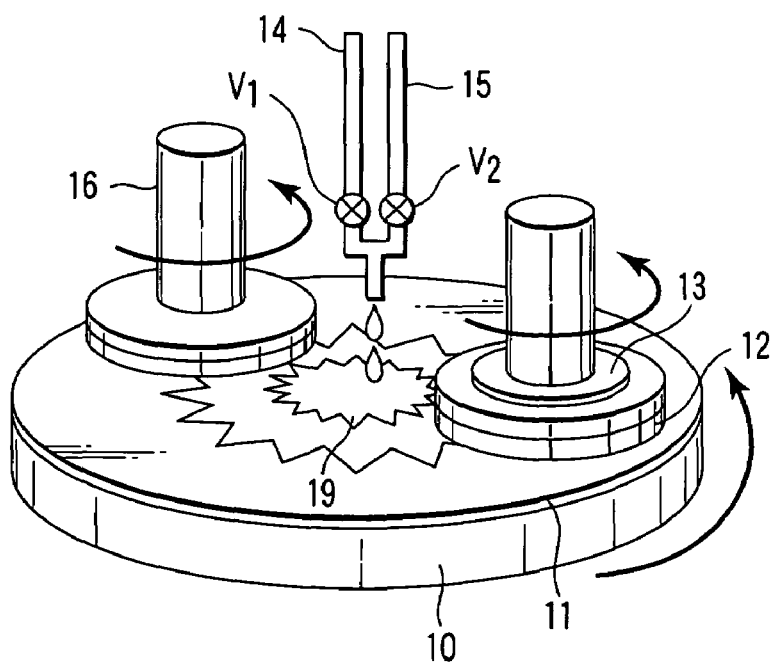
FIG. 2 is a perspective view schematically illustrating a state of the polishing step in the manufacturing method of a semiconductor device according to another embodiment of the present invention.

These two kinds of chemical solutions may be mixed together before they are fed to the polishing pad 11. In this case, as shown in FIG. 2 for example, the distal end of the first supply port 14 for feeding the first chemical solution 17 is interconnected with the distal end of the second supply port 15 for feeding the second chemical solution 18. The flow rates of the first chemical solution 17 and of the second chemical solution 18 can be adjusted respectively by the first and valves $V_1$ and $V_2$ attached to the first and second supply ports 14 and 15, respectively, before these fluids are mixed together and fed, as a slurry 19, to the polishing pad 11.

As for examples of the abrasive particles to be included in the first chemical solution 17, it is possible to employ inorganic materials such as colloidal silica, fumed silica, colloidal alumina, fumed alumina, ceria and titania. Further, it is also possible to employ organic particles and composite particles consisting of an integrated body comprising inorganic particles and organic particles.

The average particle diameter and concentration of these abrasive particles may be selected from within the ordinary ranges of CMP slurry. More specifically, these abrasive particles may have an average particle diameter selected from the range of 5 to 2000 nm and may be dispersed in water such as deionized water at a concentration ranging from 0.01 to 20 wt % or so to prepare the first chemical solution 17. The first chemical solution 17 can be fed from the first supply port 14 at a flow rate ranging from 5 to 450 mL/min for example. If the flow rate is too small, the supply of chemical solution may become insufficient. On the other hand, even if chemical solution is excessively fed to the polishing pad, it would not contribute to any enhancement of polishing effect.

The first chemical solution 17 may contain an additive such as a complexing agent, an organic acid, a surfactant and a pH-adjustor. As for examples of the complexing agent, they include quinaldinic acid, quinolinic acid, benzotriazole, alanine and glycine. As for the examples of the organic acid, they include maleic acid, oxalic acid, citric acid, malic acid and malonic acid. As for examples of the surfactant, they include potassium dodecylbenzene sulfonate, ammonium dodecylbenzene sulfonate, polyacrylic acid, potassium polyacrylate, ammonium polyacrylate, polyvinyl pyrrolidone and acetylene glycol-based nonionic surfactant. As for examples of the pH-adjustor, they include for example potassium hydroxide, TMAH (tetramethyl ammonium hydroxide), nitric acid, hydrochloric acid and acetic acid. These additives may be employed singly or in combination of two or more kinds and can be incorporated in the first chemical solution 17 at an ordinary mixing ratio.

However, the first chemical solution 17 does not contain an oxidizing agent. This oxidizing agent is included in the second chemical solution 18 to be fed from the second supply port 15. As for examples of the oxidizing agent, they include ammonium persulfate, potassium persulfate and aqueous hydrogen peroxide solution. These oxidizing agents may be dissolved in water such as deionized water at a concentration of 0.1 to 20 wt % or so, thus preparing the second chemical solution 18. This second chemical solution 18 may contain an additive such as a complexing agent, an organic acid, a surfactant and a pH-adjustor as described above. Further, the second chemical solution 18 may further contain abrasive particles. The second chemical solution 18 can be fed from the second supply port 15 at a flow rate ranging from 5 to 450 mL/min for example.

When required, a third supply port may be provided so as to enable a third chemical solution to be fed onto the polishing pad, thus preparing a slurry at a use point on the polishing pad. As for examples of the third chemical solution, they include an aqueous solution containing a surfactant, etc. This third chemical solution can be fed from the third supply port at a flow rate ranging from 5 to 450 mL/min.

When the first chemical solution 17 and the second chemical solution 18 are fed as described above, a slurry 19 can be formed on the polishing pad 11, and the semiconductor substrate 12 is contacted with the surface of the polishing pad 11 as shown in FIG. 1. The manner of holding the semiconductor substrate 12 in the polishing step will be illustrated with reference to FIG. 3. As shown in FIG. 1, the semiconductor substrate 12 is sustained by the top ring 13 which is constituted by a casing 20 and a retainer ring 21 as shown in FIG. 3. As shown in FIG. 3, through a pressing sheet 22 and a membrane 23, a pressure chamber 24 and an air bag region 26 are defined. In FIG. 3, a reference number 27 represents a chucking plate for holding the pressing sheet 22 and the membrane 23. The interior of the air bag region 26 is pressurized through the introduction of air in the direction of arrow from an air conduit 25, so that the polishing of the treating film can be performed while pressing the semiconductor substrate 12 against the polishing pad 11 through the membrane 23.

The pressure inside the air bag region 26 corresponds to a polishing load which is generally about 100-700 gf/cm$^2$. This polishing load can be controlled through the adjustment of the pressure of air to be introduced from the air conduit 25 by a pressure controller (not shown).

In the manufacturing method of a semiconductor device according to this embodiment of the present invention, the supply of the second chemical solution 18 is suspended upon finishing the polishing step and, as shown in FIG. 4, only the first chemical solution 17 is fed onto the polishing pad 11 to perform the chemical-polishing of the treating film. Since the chemical-polishing is performed while suspending the supply of the second chemical solution 18, it is now possible to considerably minimize the quantity of dust remaining on the surface of the treating film. The reason for this can be explained as follows. Namely, since the second chemical solution 18 contains an oxidizing agent, the surface of the treating film which is formed of metal will be oxidized due to the effect of this second chemical solution 18, thus creating a fragile protective film. When the treating film is polished under this condition, shavings are more likely to be generated, thus generating a great deal of dust. Whereas, when the chemical-polishing is performed with the supply of the second chemical solution 18 being suspended, the surface of the metal constituting the treating film can be hardly oxidized, thus suppressing the generation of shavings. As a result, the generation of dust can be considerably minimized, resulting in remarkable enhancement of cleaning effects.

On the occasion of chemical-polishing, only the first chemical solution 17 containing abrasive particles is fed to the polishing pad to perform the chemical-polishing of the surface of treating film according to the following action. Since the first chemical solution 17 contains abrasive particles, the friction between the polishing pad 11 and the surface of treating film (i.e. treating surface) can be reduced due to the interposition of the abrasive particles. As a result, the treating surface can be effectively chemical-polished to remove the dust. In view of this cleaning effect, it is preferable that the abrasive particles to be included in the first chemical solution 17 be formed of colloidal silica of small particle size, e.g. having an average particle diameter ranging from 5 to 200 nm or so.

When a pH-adjustor or an additive other than oxidizing agent is included in the first chemical solution 17, a repulsive force generates between dust or abrasive particles and the treating surface due to the effects of these additive components. As a result, the effects of cleaning the treating surface can be much more enhanced.

Further, since only the second chemical solution 18 constituting part of the slurry 19 employed during the polishing is excluded, there will be no problem with respect to the compatibility between the components of slurry and the chemical solution (the first chemical solution 17) to be employed in the chemical-polishing. Due to the omission of the second chemical solution 18 as described above, the step of rinsing with deionized water between the polishing step and the chemical-polishing step can be dispensed with, thus making it possible to enhance the throughput. Moreover, since it is not required to additionally install any equipment dedicated to the chemical solution, it is also advantageous in terms of enhancing the productivity.

As described above, since the supply of the second chemical solution is suspended on the occasion of performing the chemical-polishing, thereby preventing only the oxidative effect from taking place, the generation of problems that have been conventionally encountered due to the compatibility and mixing between the slurry employed in the polishing step and a chemical solution can be obviated. Further, since there is little possibility of the oxidative effect taking place, it is possible to enable a strong protective film to be formed on the surface of Cu due to a weak oxidative action, thus making it possible to realize excellent finishing of CMP.

Moreover, in the case of the manufacturing method of a semiconductor device according to the embodiment of the present invention, the chemical-polishing where the supply of the second chemical solution is suspended is performed at a second load. The second load is smaller than the first load which is the polishing load on the occasion of polishing using two kinds of chemical solutions. The manner of holding the semiconductor substrate 12 on the occasion of chemical-polishing will be explained with reference to FIG. 5.

By controlling the pressure inside the air bag region 26 by the air conduit 25, the load at the step of chemical-polishing can be adjusted. When the load is reduced in this manner, the chemical-polishing can be performed while suppressing the generation of scratches or cracks in the surface of the treating film.

Further, it is also possible to control the load in such a manner that the semiconductor substrate 12 is prevented from being pressed against the polishing pad 11. This can be achieved by sucking the air in the direction of the arrow through the air conduit 25 as shown in FIG. 5. More specifically, when the air in the air bag region 26 is sucked through the air conduit 25 by controlling a pressure controller (not shown), the pressure inside the air bag region 26 is reduced, thus making it possible to lift up the semiconductor substrate 12. As a result, it is now possible to perform the chemical-polishing of the treating film without pressing the semiconductor substrate 12 against the polishing pad 11.

By performing the chemical-polishing step at a lower load than that of the polishing step, it is possible to obtain the effect of minimizing the generation of scratches in the surface of the treating film. If the load is suppressed to not more than 70 $gf/cm^2$, the number of scratches can be suppressed to not more than $5/cm^2$.

In the method according to the embodiment of the present invention, a conductive film as a treating film is polished in the polishing step to be executed in advance. This conductive film can be formed on an insulating film having a recess by depositing a wiring material film with a barrier metal being interposed therebetween. The polishing step may be a first polishing where the wiring material film is polished so as to expose the surface of barrier metal or a touch-up CMP where barrier film is removed so as to expose the surface of the insulating film. In the method according to the embodiment of the present invention, since the step of chemical-polishing is performed by slidably contacting the treating film and the underlayer film with the polishing pad 11 at a lower load than that of the polishing step with the first chemical solution 17 being interposed therebetween, it is possible to minimize the damage to an underlayer film such as a barrier film or an insulating film. Since a low dielectric constant insulating film (Low-k film) having a relative dielectric constant of not more than 2.9 is low in mechanical strength, if the insulating film is formed of such a low dielectric constant insulating film, there are much possibilities of generating scratches or cracks on the occasion of chemical-polishing. The method according to the embodiment of the present invention is especially effective in minimizing the generation of scratches and cracks on the occasion of performing the aforementioned touch-up CMP.

Embodiment 1

This embodiment will be explained with reference to FIGS. 6 and 7.

First of all, as shown in FIG. 6, LKD27 (JSR Co., Ltd.) having a film thickness of 6000 angstroms was deposited on a semiconductor substrate 30 having an element (not shown) formed thereon, thus forming an insulating film 31. Then, a trench 35 having a depth of 3000 angstroms was formed in the insulating film 31. The LKD27 herein for forming the insulating film 31 was a low dielectric constant insulating film having a relative dielectric constant of about 2.9. As a conductive film 34, a barrier metal 32 and a wiring material film 33 were formed by a sputtering (seed layer) and plating method. As for the barrier metal 32, a TaN film having a film thickness of 100 angstroms was formed. As for the wiring material film 33, a Cu film having a film thickness of 6000 angstroms was formed. Incidentally, the insulating film 31 may be formed by using TEOS (tetraethoxy silane), SiLK (Dow Chemical Co. Ltd., U.S.), Coral (Novellus Systems, Inc., U.S.), or Black Diamond (Applied Materials, Co. Ltd., U.S.). Further, barrier metal 32 may be formed of a single layer or a laminate of Ta, Ti or TiN other than aforementioned TaN. Further, the wiring material film 33 may be formed of Al, W, etc.

Then, the wiring material film 33 as a treating film was polished to expose the surface of the barrier metal 32. More specifically, as shown in FIG. 1, the top ring 13 holding the semiconductor substrate 12 was contacted with the polishing pad 11 at a polishing load of 400 gf/cm$^2$ while rotating the turntable 10 having the polishing pad 11 attached thereon at a speed of 100 rpm. As for the polishing pad 11, IC1000 (Rodel Co., Ltd.) was employed and the top ring 13 was rotated at a speed of 100 rpm.

As for the first chemical solution 17 to be supplied from the first supply port 14, a mixed solution comprising CMS7401 (JSR Co., Ltd.), CMS7452 (JSR Co., Ltd.) and deionized water, the mixing ratio thereof being 1:1:2 (weight ratio), was employed. From the second supply port 15, an aqueous solution of ammonium persulfate (6 wt %) was supplied as the second chemical solution 18. Incidentally, the CMS7401 contained an additive other than an oxidizing agent and the CMS7452 contained abrasive particles. The flow rates of the first chemical solution and the second chemical solution were both set to 200 mL/min and were mixed together at the use point on the polishing pad 11, thus preparing a slurry 19. By using the slurry 19 thus obtained, a Cu film as the wiring material film 33 was polished. The polishing rate of the Cu film was about 10000 angstroms/min.

Then, the supply of the aqueous solution of ammonium persulfate (6 wt %) as the second chemical solution 18 was suspended and only the first chemical solution 17 was used for performing the chemical-polishing for 15 seconds as shown in FIG. 4. On this occasion, by holding the semiconductor 12 by using the suction of the air conduit 25 as shown in FIG. 5, it was possible to reduce the polishing load to 10 gf/cm$^2$ or less.

When the entire surface of wafer was observed by a defect-assessment apparatus after the chemical-polishing, the number of dust was about 21/wafer.

For the purpose of comparison, when wash-polishing was performed for 15 seconds by using deionized water according to the conventional process after the treating surface was polished by using two kinds of chemical solutions in the same manner as described above, as many as 1042/wafer of dust were found generated on the surface of the wafer upon finishing the wash-polishing.

In view of the aforementioned results, it was confirmed that it was possible, through the employment of the method of this embodiment, to greatly reduce the number of dust after the chemical-polishing. Since the presence of dust may become a cause for generating scratches or peeling of film in the subsequent step, the reduction in number of dust would lead to the enhancement of reliability of semiconductor device to be produced.

Embodiment 2

By repeating the same procedures as described in the aforementioned Embodiment 1, the surface of the barrier metal 32 was exposed as shown in FIG. 7. The insulating film 31, the barrier metal 32 and the wiring material film 33 were all formed using the same materials as described above so as to have the same thicknesses as described above.

Then, the barrier metal 32 was polished so as to expose the surface of insulating film 31 as shown in FIG. 8. More specifically, as shown in FIG. 1, the top ring 13 holding the semiconductor substrate 12 was contacted with the polishing pad 11 at a polishing load of 400 gf/cm$^2$ while rotating the turntable 10 having the polishing pad 11 attached thereon at a speed of 100 rpm. As for the polishing pad 11, IC1000 (Rodel Co., Ltd.) was employed and the top ring 13 was rotated at a speed of 100 rpm.

As for the first chemical solution 17 to be supplied from the first supply port 14, a mixed solution comprising CMS8401 (JSR Co., Ltd.), CMS8452 (JSR Co., Ltd.) and deionized water (DIW), the mixing ratio thereof being 1:2:3 (weight ratio), was employed. From the second supply port 15, an aqueous solution of hydrogen peroxide (2 wt %) was supplied as the second chemical solution 18. Incidentally, the CMS8401 contained an additive other than an oxidizing agent and the CMS8452 contained abrasive particles. The flow rate of the first chemical solution was set to 200 mL/min and the flow rate of the second chemical solution was set to 20 mL/min, and these first and second chemical solutions were mixed together at the use point on the polishing pad 11, thus preparing a slurry 19. By using the slurry 19 thus obtained, a TaN film as the barrier film 32 was polished. The polishing rate of the TaN film was about 700 angstroms/min.

Then, the supply of the aqueous solution of hydrogen peroxide (2 wt %) as the second chemical solution 18 was suspended and only the first chemical solution 17 was used for performing the chemical-polishing for 30 seconds. When the entire surface of wafer was observed in the same manner as described above after the chemical-polishing, the number of dust was about 12/wafer.

For the purpose of comparison, when wash-polishing was performed for 30 seconds by using deionized water according to the conventional process after the treating surface was polished by using two kinds of chemical solutions in the same manner as described above, as many as 560/wafer of dust were found generated on the surface of the wafer.

Further, the chemical-polishing was performed in the same manner as described above by suspending the supply of the second chemical solution and, at the same time, reducing the polishing load. More specifically, the polishing load was reduced by holding, through suction the semiconductor substrate 12 by using the air conduit 25 as shown in FIG. 5. By controlling the sucking pressure a pressure controller, the load was altered, thereby performing the chemical-polishing at various polishing loads.

After the chemical-polishing, the scratches on the surface of insulating film 31 were observed by a defect-assessment apparatus so as to investigate the relationship between the load and the generation of scratches. The results thus obtained are shown in the graph of FIG. 9. It will be recognized that it was possible to reduce the number of scratches by reducing the load. In particular, when the load was reduced to not more than 70 gf/cm$^2$, it was possible to suppress the number of scratches to 5/cm$^2$ or less. As described above, it was confirmed that the generation of scratches or cracks in a Low-k film such as LKD27 film could be suppressed by reducing the load on the occasion of chemical-polishing.

According to one aspect of the present invention, it is possible to provide a method of manufacturing a semiconductor device excellent in reliability, while making it possible to prevent the generation of defectives.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:

depositing a barrier metal above an insulating film formed above a semiconductor substrate and having a recess;

depositing a wiring material film on the barrier metal;

polishing the wiring material film while feeding a first chemical solution containing abrasive particles and a second chemical solution containing an oxidizing agent over a polishing pad, thereby exposing the barrier metal, the wiring material film being in contact with the polishing pad at a first load;

subsequent to the polishing of the wiring material film, subjecting a surface of the wiring material film to a chemical-polishing by continuing the feeding of the first chemical solution over the polishing pad while suspending the feeding of the second chemical solution, the wiring material film being in contact with the polishing pad at a second load which is smaller than the first load;

after the chemical-polishing of the wiring material film, polishing the barrier metal while feeding a first chemical solution containing abrasive particles and a second chemical solution containing an oxidizing agent over a polishing pad, thereby exposing the insulating film while leaving the wiring material film and the barrier metal in the recess, the barrier metal being in contact with the polishing pad at a first load; and subsequent to the polishing of the barrier metal, subjecting a treating film including the wiring material film and the barrier metal left in the recess to a chemical-polishing by continuing the feeding of the first chemical solution over the polishing pad while suspending the feeding of the second chemical solution, the treating film being in contact with the polishing pad at a second load which is smaller than the first load applied when the barrier metal is polished.

2. A method for manufacturing a semiconductor device comprising:

depositing a barrier metal above an insulating film formed above a semiconductor substrate and having a recess;

depositing a wiring material film on the barrier metal;

polishing the wiring material film while feeding a first chemical solution containing abrasive particles and a second chemical solution containing an oxidizing agent over a polishing pad, thereby exposing the barrier metal, the wiring material film being in contact with the polishing pad at a first load;

subsequent to the polishing of the wiring material film, subjecting a surface of the wiring material film to a chemical-polishing by continuing the feeding of the first chemical solution over the polishing pad while suspending the feeding of the second chemical solution, the wiring material film being in contact with the polishing pad at a second load which is smaller than the first load; and after the chemical-polishing of the wiring material film, polishing the barrier metal while feeding a first chemical solution containing abrasive particles and a second chemical solution containing an oxidizing agent over the polishing pad.

3. The method according to claim 2, wherein the first load is confined to the range of 100 to 700 gf/cm$^2$.

4. The method according to claim 2, wherein the second load is confined to not more than 70 gf/cm$^2$.

5. The method according to claim 2, wherein the abrasive particles contained in the first chemical solution are formed of colloidal silica.

6. The method according to claim 5, wherein the colloidal silica has an average particle diameter ranging from 5 to 200 nm.

7. The method according to claim 2, wherein the first chemical solution further contains at least one selected from the group consisting of a complexing agent, an organic acid, a surfactant and a pH-adjustor.

8. The method according to claim 2, wherein the oxidizing agent contained in the second chemical solution is selected from the group consisting of ammonium persulfate, potassium persulfate and aqueous hydrogen peroxide solution.

9. The method according to claim 2, wherein the first chemical solution is free from an oxidizing agent.

* * * * *